(12) United States Patent
Zhai et al.

(10) Patent No.: US 11,985,077 B2
(45) Date of Patent: May 14, 2024

(54) CONTROLLER WITH DIRECT COMMUNICATION AND REDRIVER MODES

(71) Applicant: Renesas Electronics America Inc., Milpitas, CA (US)

(72) Inventors: Shubing Zhai, San Jose, CA (US); James Wang, Shanghai (CN); Jankin Hu, Shanghai (CN); Wei Wang, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 479 days.

(21) Appl. No.: 17/317,188

(22) Filed: May 11, 2021

(65) Prior Publication Data
US 2022/0368653 A1 Nov. 17, 2022

(51) Int. Cl.
*H04L 49/253* (2022.01)
*H03K 17/687* (2006.01)
*H03K 19/0175* (2006.01)

(52) U.S. Cl.
CPC ....... *H04L 49/253* (2013.01); *H03K 17/6871* (2013.01); *H03K 19/017509* (2013.01)

(58) Field of Classification Search
CPC .............. H04L 49/253; H03K 17/6871; H03K 19/017509; H03K 17/002; H03K 17/693; G06F 13/102

See application file for complete search history.

(56) References Cited

U.S. PATENT DOCUMENTS

| | | | | |
|---|---|---|---|---|
| 8,645,724 | B2* | 2/2014 | Jaramillo | H04L 25/0298 326/38 |
| 2014/0077613 | A1* | 3/2014 | Song | H04B 5/79 307/104 |
| 2014/0215237 | A1* | 7/2014 | Natarajan | G06F 1/3268 713/320 |
| 2020/0304467 | A1* | 9/2020 | Cozzetti | H04L 63/1425 |

* cited by examiner

*Primary Examiner* — Ayanah S George
(74) *Attorney, Agent, or Firm* — SCULLY, SCOTT, MURPHY & PRESSER, P.C.

(57) ABSTRACT

Systems and methods for routing communication among a plurality of devices are described. In an example, a controller can detect a communication initiated from a first device to a target device among a second device and a third device. The controller can identify the second device as the target device. The controller can, in response to identifying the second device as the target device, activate a direct communication path between the first device and the second device to allow the first device to communicate with the second device using direct communication mode. The controller can, in response to identifying the second device as the target device, activate redriver path between the first device and the third device to allow the first device to communicate with the third device using redriver mode.

20 Claims, 5 Drawing Sheets

CONTROLLER WITH DIRECT COMMUNICATION AND REDRIVER MODES

BACKGROUND

The present disclosure relates in general to devices, systems, and methods that can route communications from a host device to a plurality of devices by dynamically switching between a analog switch mode and a redriver mode.

In some example applications, such as a control system or a network, a host device can control or manage a plurality of devices. The host device can be connected to the plurality of devices via a bus. The bus can facilitate transmission of various types of signals carrying information or data among the host device and the plurality of devices. These signals can be transmitted on printed circuit board (PCB) traces under a one-to-many (e.g., 1:N) routing topology.

SUMMARY

In some examples, an apparatus for routing communications among a plurality of devices is generally described. The apparatus can include a logic circuit connected to a first device, a second device, and a third device. The apparatus can further include a controller connected to the logic circuit and the first device. The controller can be configured to detect a communication initiated from the first device to a target device among the second device and the third device. The controller can be further configured to identify the second device as the target device. The controller can be further configured to, in response to the identification of the second device as the target device, activate, in the logic circuit, a direct communication path between the first device and the second device to allow the first device to communicate with the second device using direct communication mode. The controller can be further configured to, in response to the identification of the second device as the target device, activate, in the logic circuit, a redriver path between the first device and the third device to allow the first device to communicate with the third device using redriver mode.

In some examples, a system for routing communications among a plurality of devices is generally described. The system can include a first device, a second device, a third device, a logic circuit, and a controller. The logic circuit can be connected to the first device, the second device, and the third device. The controller can be connected to the logic circuit and the first device. The controller can be configured to detect a communication initiated from the first device to a target device among the second device and the third device. The controller can be further configured to identify the second device as the target device. The controller can be further configured to, in response to the identification of the second device as the target device, activate a direct communication path between the first device and the second device to allow the first device to communicate with the second device using direct communication mode. The controller can be further configured to, in response to the identification of the second device as the target device, activate a redriver path between the first device and the third device to allow the first device to communicate with the third device using redriver mode.

In some examples, a method for routing communication among a plurality of devices is generally described. The method can include detecting a communication initiated from a first device to a target device among a second device and a third device. The method can further include identifying the second device as the target device. The method can further include in response to identifying the second device as the target device, activating a direct communication path between the first device and the second device to allow the first device to communicate with the second device using direct communication mode. The method can further include in response to identifying the second device as the target device, activating a redriver path between the first device and the third device to allow the first device to communicate with the third device using redriver mode.

Further features as well as the structure and operation of various embodiments are described in detail below with reference to the accompanying drawings. In the drawings, like reference numbers indicate identical or functionally similar elements.

DETAILED DESCRIPTION

Figure 1:
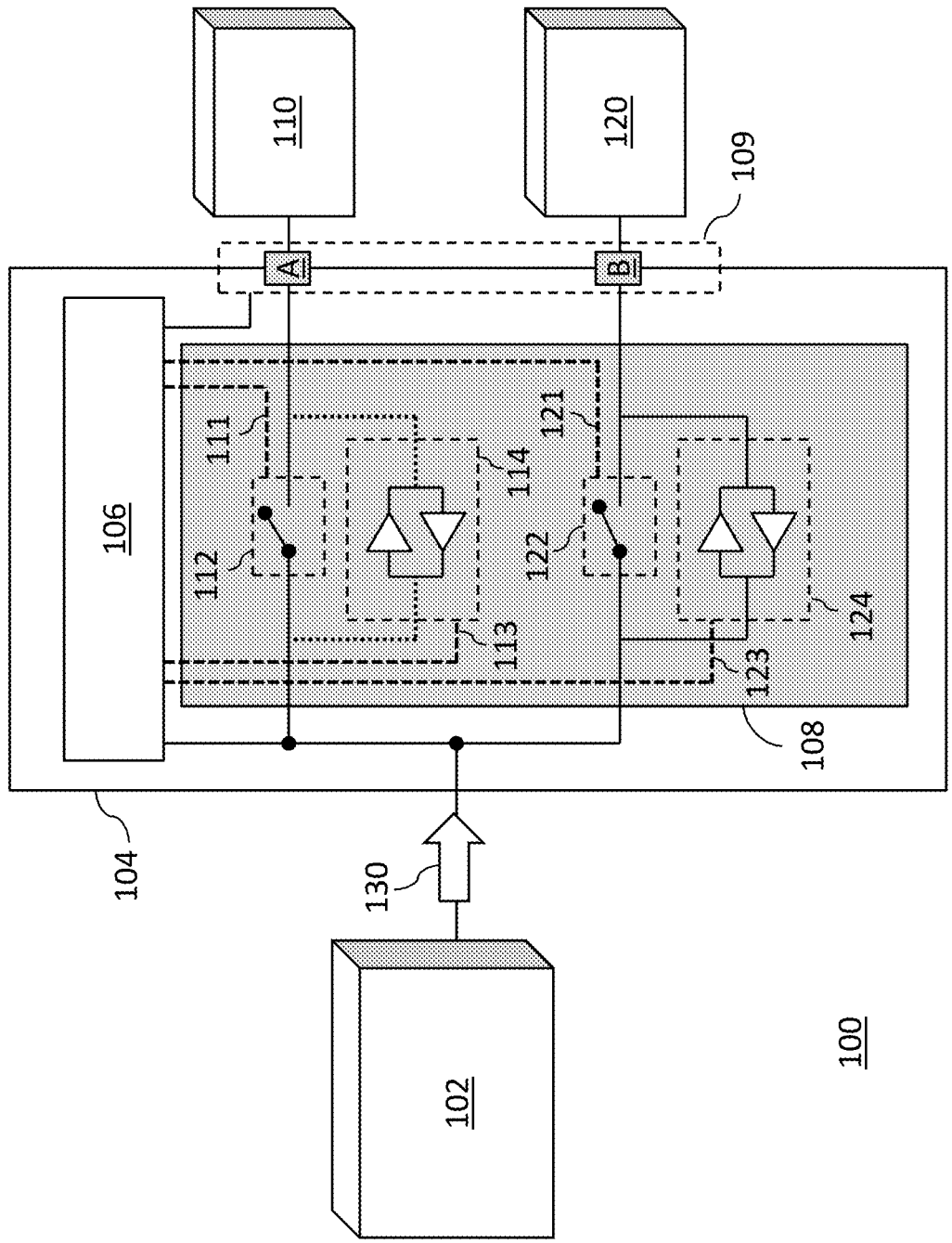
FIG. 1 is a diagram showing an example system that can implement bridging device with analog switch and redriver modes in one embodiment.

FIG. 1 is a diagram showing an example system 100 that can implement a bridging device with analog switch and redriver modes in one embodiment. The system 100 can include a host device 102, an apparatus or integrated circuit 104, a device 110, and another device 120. The host device 102 can be connected to the integrated circuit 104, and the integrated circuit 104 can be connected to the device 110 and the device 120. The host device 102 can be a computer device, a server processor, a group of devices that sharing a cluster, a circuit board, a chip package, or a virtual partition. In some examples, the host device 102 can be a host device of a control system, and the devices 110, 120 can be peripheral devices being managed or controlled by the host device 102. In some examples, the host device 102 can be a network host or a master device of a network, and the devices 110, 120 can be peripheral devices or slave devices connected to the network. In some examples, the host device 102 can be connected to the integrated circuit 104 through a first set of traces of a communication bus, and the integrated circuit 104 can be connected to the device 110 and the device 120 through a second set of traces of the communication bus. Although one master device (e.g., the host device 102) and two slave devices (e.g., the device 110 and the device 120) are shown in FIG. 1, it will be apparent to a person of ordinary skill in the art that the methods and systems described herein can be applied to an arbitrary number of master and slave devices.

The integrated circuit 104 can include a control circuit or a controller 106, and a control logic or logic circuit 108. The integrated circuit 104 can further include a plurality of interfaces or ports 109, where a port A can be connected to the device 110 and a port B can be connected to the device 120. In an example, the controller 106 can include a memory device (not shown) that can be configured to store mappings (e.g., lookup table, database, etc.) between addresses of the devices 110, 120, and the ports 109 that can indicate assignment of different ports to different peripheral devices. In some examples, the controller 106 can be a microcontroller or a standalone device that interfaces with the host device 102 and the devices 110, 120.

The logic circuit 108 can include an analog switch or a switching element 112 connected to the device 110. The switching element 112 can be, for example, a field effect transistor (FET). The controller 106 can be configured to activate the switching element 112 (e.g., close the first switch) to form or activate a direct communication path between the host device 102 and the device 110. For example, the controller 106 can send a control signal 111 to the switching element 112, where the control signal 111 to activate or deactivate the switching element 112. The logic circuit 108 can further include a redriver circuit 114 connected to the device 110. The redriver circuit 114 can be a repeater integrated circuit (IC) configured to receive a signal and regenerate the received signal to facilitate a delayed transmission of the received signal. The controller 106 can be configured to enable or activate the redriver circuit 114 to form or activate a redriver path between the host device 102 and the device 110. For example, the controller 106 can be configured to send a control signal 113 to the redriver circuit 114, where the control signal 113 can activate or deactivate the redriver circuit 114. By way of example, a redriver circuit can include a first channel and a second channel arranged to transmit signals in opposite directions from each other. Each one of the first and second channels can include components such as equalizers and buffers. To regenerate signals, the redriver can receive and recover a signal, and re-drive the recovered signal to a destination side (e.g., to the device 110). In the example shown in FIG. 1, the redriver circuit 114 can be a bidirectional redriver such that the redriver circuit 114 can be configured to regenerate and drive the signal to both directions (e.g., towards the host device 102 and towards the device 110). The regenerated signal being outputted by the redriver can be a delayed version of the received or recovered signal.

The logic circuit 108 can include an analog switch or a switching element 122 connected to the device 120. The switching element 122 can be, for example, a field effect transistor (FET). The controller 106 can be configured to activate the switching element 122 (e.g., close the second switch) to form or activate a direct communication path between the host device 102 and the device 120. For example, the controller 106 can send a control signal 121 to the switching element 122, where the control signal 121 to activate or deactivate the switching element 122. The logic circuit 108 can further include a redriver circuit 124 connected to the device 120. The redriver circuit 124 can be configured to receive a signal and regenerate the received signal to facilitate a delayed transmission of the received signal. The controller 106 can be configured to enable or activate the redriver circuit 124 to form or activate a redriver path between the host device 102 and the device 120. For example, the controller 106 can be configured to send a control signal 123 to the redriver circuit 124, where the control signal 123 can activate or deactivate the redriver circuit 124.

The controller 106 can be configured to detect a communication 130 initiated from the host device 102 to a target device among the device 110 and the device 120. In some examples, the communication 130 can include information or data, and may be outputted by the host device 102 as a data packet having a data frame structure in accordance with the communication bus being implemented in the system 100. In an example, to detect the communication 130, the controller 106 can analyze a data frame structure of the data among the communication 130 outputted or initiated from the host device 102. For example, the controller 106 can be configured to identify a transaction start, a transaction stop, an address phase, and a frame format of the data frame structure. In an example, an identification of a transaction start in the data frame structure can indicate that the communication 130 is a valid request for a transaction, such as a transmission of data to a target device. In examples where the controller 106 may include a memory device to store lookup tables, or mappings, that map peripheral devices (e.g., devices 110 and 120) to ports (e.g., ports 109), the controller 106 can search, in the lookup table or mappings, for an address indicated by the address phase of the frame structure to identify a target device among the device 110 and the device 120.

In an example, the controller 106 can be configured to identify one of the devices 110 and 120 as the target device indicated by the communication 130. Based on the identification of the target device, the controller 106 can be configured to activate a direct communication mode of the target device, and activate a redriver mode for the rest of the devices 110 and 120 that are not identified as the target device. By selectively activating the direct communication mode and redriver mode for different devices, the controller 106 can allow all devices to listen to the traffic in the system 100 because non-target devices can also receive copies of the data being received by the target device.

Figure 2:
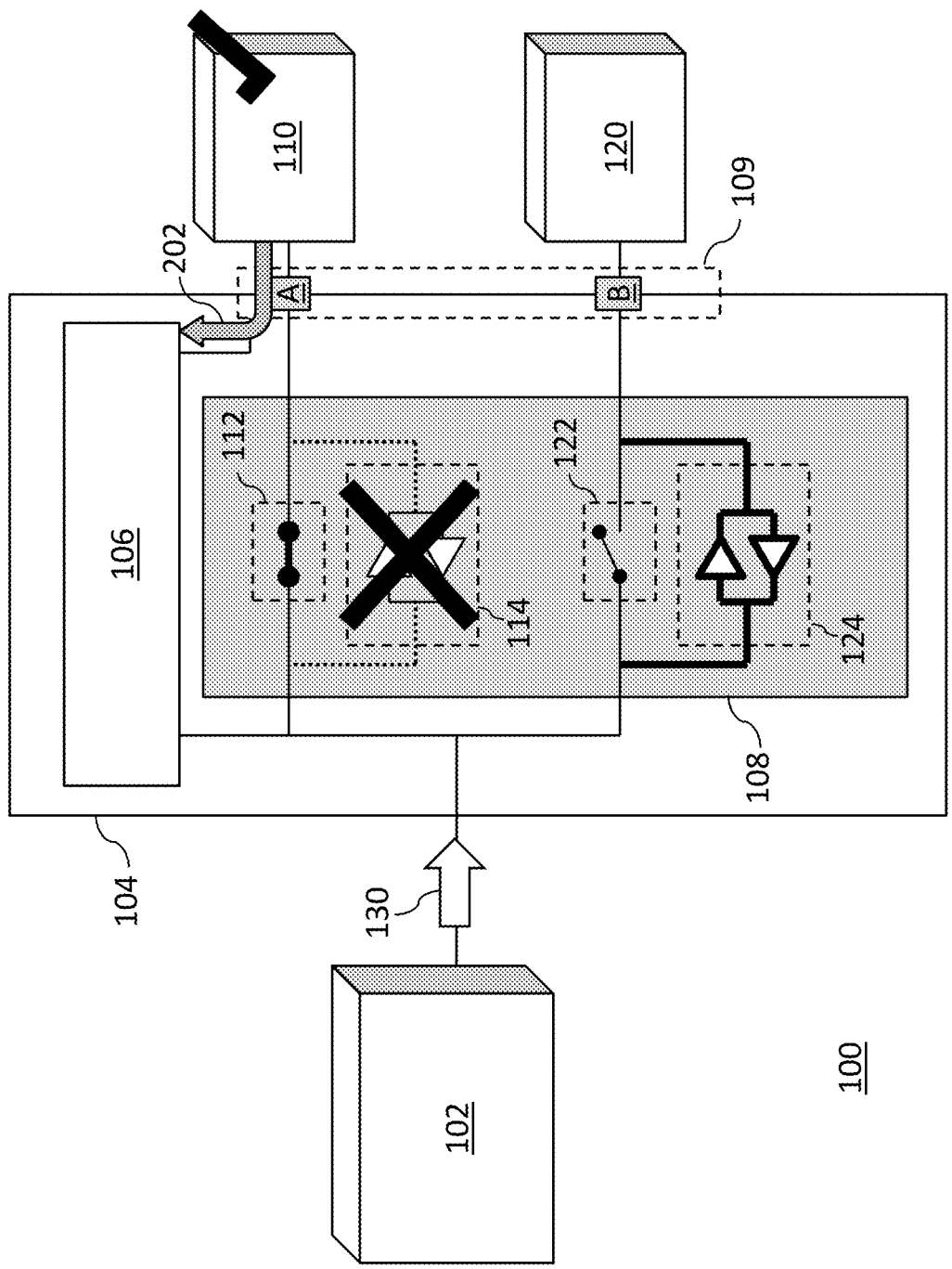
FIG. 2 is a diagram showing an example implementation of the system shown in FIG. 1 in one embodiment.

FIG. 2 is a diagram showing an example implementation of the system 100 shown in FIG. 1 in one embodiment. In an example, the data among the communication 130 can include an address of the target device. The communication 130 can be distributed to the device 110 and 120 via the controller 106. Each one of the devices 110 and 120 can receive the target device address in the communication 130, and compare its own address with the target device address. In the example shown in FIG. 2, the device 110 can determine that its own address matches the target device address in the communication 130, and sends an acknowledgement 202 to the controller 106 via its assigned port (e.g., port A). The acknowledgement 202 can be, for example, an acknowledge signal. In some examples, the controller 106 can receive the acknowledgement 202 from the port A. In response to receiving the acknowledgement from port A, the controller 106 can search (e.g., in a memory, database, lookup table, etc.) for a device that is assigned to the port A. In the example shown in FIG. 2, the device 110 is assigned to the port A, which can indicate that the acknowledgement 202 is sent to the controller 106 from the device 110. Based on the acknowledgement 202 being sent by the device 110, the controller 106 can determine that the device 110 has an address matching the target address in the communication 130 and identify the device 110 as the target device.

In response to the identification of the device 110 as the target device, the controller 106 can activate the switching element 112 to activate a direct communication path between the host device 102 and the device 110. In the example shown in FIG. 2, the controller 106 can activate the switching element 112 by closing a switch. The activation of the direct communication path between the host device 102 and the device 110 can allow the host device 102 to communicate with the device 110 using direct communication mode. The direct communication mode can be a point-to-point communication mode, such that the host device 102 can communicate with the device 110 directly through the closed first switch (e.g., the activated switching element 112). Further, in response to the identification of the device 110 as the target device, the controller 106 can enable or activate the redriver circuit 124 to activate a redriver path between the host device 102 and the device 120. The activation of the redriver path between the host device 102 and the device 120 can allow the host device 102 to communicate with the device 120 using the redriver mode. In an example, the redriver mode can extend a length of time of communications between devices by receiving a signal and delaying the received signal, and also outputting the delayed signal towards one particular direction. For example, The controller 106 can control the redriver 114 to output the delayed signal to either the device 110 or the host device 102.

Thus, in response to the identification of the device 110 as the target device, the controller 106 and the host device 102 can communicate with the device 110 (e.g., the target device) using direct communication and can communicate with other devices using the redriver mode. This selective communication scheme can allow the host device 102 to, for example, transmit data to the device 110 and the device 120, where the device 120 can receive the data at a later time than the device 110.

In an example, the controller 106 can continue to analyze the data frame structure of data being transmitted between the host device 102 and the device 110 until a transaction stop, or other transaction finish symbol is detected or identified in the data frame structure (e.g., a repeat start in I3C protocol). In response to detecting a transaction stop, the controller 106 can listen for or monitor for new communications or transactions between the host device 102 and the devices 110, 120. For example, the controller 106 can detect a new communication initiated from the host device 102 to a new target device among the device 110 and the device 120. If the new target device is the device 120, the controller 106 can deactivate the switching element 112 and deactivate the redriver circuit 124, and activate the switching element 122 and activate the redriver circuit 114 to allow the host device 102 to communicate with the device 120 (the new target device) using the direct communication mode, and to communicate with the device 110 (the non-target device) using the redriver mode. Thus, the controller 106 can be configured to dynamically switch communication modes for individual managed or peripheral device in the system 100.

Figure 3A:
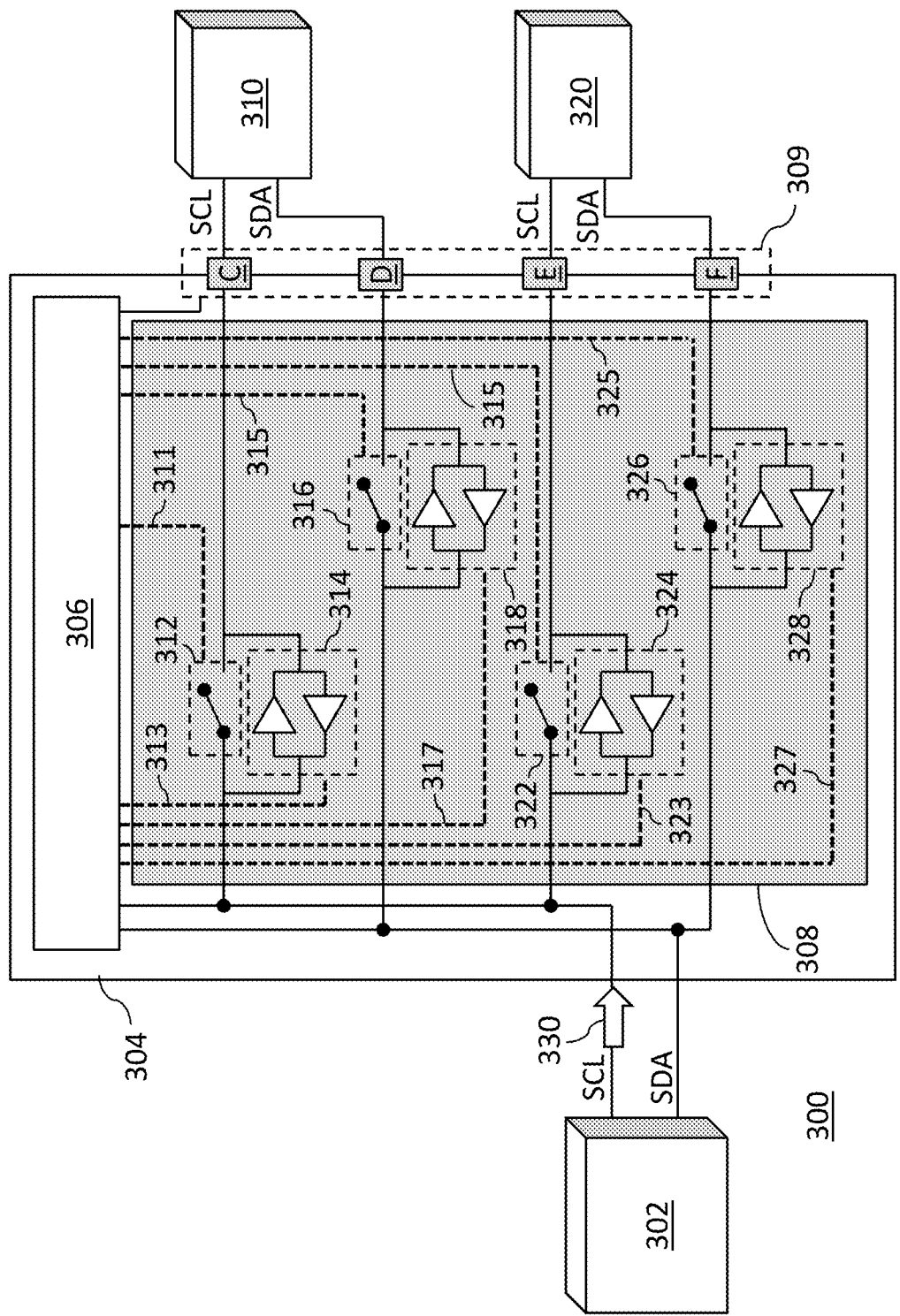
FIG. 3A is a diagram showing an example application that can utilize the system shown in FIG. 1 in one embodiment.

FIG. 3A is a diagram showing an example application that can utilize the system shown in FIG. 1 in one embodiment. An example system 300 is shown in FIG. 3, where the system 300 can implement an I3C communication protocol. The system 300 can include a host device 302, an integrated circuit 304, a device 310, and another device 320. The host device 302 can be connected to the integrated circuit 304, and the integrated circuit 304 can be connected to the device 310 and the device 320. The host device 302 can be a computer device, a server processor, a group of devices that sharing a cluster, a circuit board, a chip package, or a virtual partition. In some examples, the host device 302 can be a I3C master device of an I3C network and the devices 310, 320 can be I3C slave devices. In some examples, the host device 302 can be connected to the integrated circuit 304 through a first set of traces of an I3C bus, and the integrated circuit 304 can be connected to the device 310 and the device 320 through a second set of traces of the I3C bus. In the example shown in FIG. 3, a bus (e.g., an I3C bus) of the system 300 can include a clock line SCL and a data line SDA. The SCL line can be used for synchronizing all data transfers over the I3C bus in the system 300. The SDA line can be a line or trace for data transfer.

The integrated circuit 304 can include a control circuit or a controller 306, and a control logic or a logic circuit 308. The integrated circuit 304 can further include a plurality of interfaces or ports 309, where each port can be connected to one of the devices 310 and 320. In an example, the controller 306 can include a memory device (not shown) that can be configured to store mappings (e.g., lookup table, database, etc.) between the devices 310, 320, and the ports that can indicate assignment of different ports to different peripheral devices. In some examples, the controller 306 can be a microcontroller or a standalone device that interfaces with the host device 302 and the devices 310, 320.

The logic circuit 308 can include an analog switch or a switching element 312 connected between the host device 302 and the device 310 via the SCL line. The switching element 312 can be, for example, a field effect transistor (FET). The controller 306 can be configured to activate the switching element 312 to form or activate a direct communication path on the SCL line between the host device 302 and the device 310 via a port C. For example, the controller 306 can send a control signal 311 to the switching element 312, where the control signal 311 to activate or deactivate the switching element 312. The logic circuit 308 can further include a redriver circuit 314 connected between the host device 302 and the device 310 via the SCL line. The controller 306 can be configured to enable or activate the redriver circuit 314 to form or activate a redriver path between the host device 302 and the device 310 on the SCL line via a port D. For example, the controller 306 can be configured to send a control signal 313 to the redriver circuit 314, where the control signal 313 can activate or deactivate the redriver circuit 314.

The logic circuit 308 can further include an analog switch or a switching element 316 connected between the host device 302 and the device 310 via the SDA line. The switching element 316 can be, for example, a field effect transistor (FET). The controller 306 can be configured to activate the switching element 316 to form or activate a direct communication path on the SDA line between the host device 302 and the device 310 via a port E. For example, the controller 306 can send a control signal 315 to the switching element 316, where the control signal 315 to activate or deactivate the switching element 316. The logic circuit 308 can further include a redriver circuit 318 connected between the host device 302 and the device 310 via the SDA line. The controller 306 can be configured to enable or activate the redriver circuit 318 to form or activate a redriver path between the host device 302 and the device 310 on the SDA line via a port F. For example, the controller 306 can be configured to send a control signal 317 to the redriver circuit 318, where the control signal 317 can activate or deactivate the redriver circuit 318.

The logic circuit 308 can further include an analog switch or a switching element 322 connected between the host device 302 and the device 320 via the SCL line. The switching element 312 can be, for example, a field effect transistor (FET). The controller 306 can be configured to activate the switching element 322 to form or activate a direct communication path on the SCL line between the host device 302 and the device 320. For example, the controller 306 can send a control signal 321 to the switching element 322, where the control signal 321 to activate or deactivate the switching element 322. The logic circuit 308 can further include a redriver circuit 324 connected between the host device 302 and the device 320 via the SCL line. The controller 306 can be configured to enable or activate the redriver circuit 324 to form or activate a redriver path between the host device 302 and the device 310 on the SCL line. For example, the controller 306 can be configured to send a control signal 323 to the redriver circuit 324, where the control signal 323 can activate or deactivate the redriver circuit 324.

The logic circuit 308 can further include an analog switch or a switching element 326 connected between the host device 302 and the device 310 via the SDA line. The switching element 326 can be, for example, a field effect transistor (FET). The controller 306 can be configured to activate the switching element 326 to form or activate a direct communication path on the SDA line between the host device 302 and the device 320. For example, the controller 306 can send a control signal 325 to the switching element 326, where the control signal 325 to activate or deactivate the switching element 326. The logic circuit 308 can further include a redriver circuit 328 connected between the host device 302 and the device 320 via the SDA line. The controller 306 can be configured to enable or activate the redriver circuit 328 to form or activate a redriver path between the host device 302 and the device 320 on the SDA line. In an example, the controller 306 can be configured to send a control signal 327 to the redriver circuit 328, where the control signal 327 can activate or deactivate the redriver circuit 328.

The controller 306 can be configured to detect a communication 330 initiated from the host device 302 to a target device among the device 310 and the device 320. In some examples, the communication 330 can include information or data, and may be outputted by the host device 302 as a data packet having a data frame structure in accordance with the communication bus being implemented in the system 300. In an example, to detect the communication 330, the controller 306 can analyze a data frame structure of the data among the communication 330 outputted or initiated from the host device 302. For example, the controller 306 can be configured to identify a transaction start, a transaction stop, an address phase, and a frame format of the data frame structure.

In an example, the controller 306 can be configured to identify one of the devices 310 and 320 as the target device indicated by the communication 330. The data among the communication 330 can include an address of the target device. The communication 330 can be distributed to the devices 310 and 320 via the controller 306. Each one of the devices 310 and 320 can receive the target device address in the communication 330, and compare its own address with the target device address. In the example shown in FIG. 3, the device 310 can determine that its own address matches the target device address in the communication 330, and sends an acknowledgement 302 to the controller 306 via its assigned port (e.g., via the port D on the SDA line), where the acknowledgement 302 can be, for example, an acknowledge signal. The controller 306 can receive the acknowledgement from a specific port. In response to receiving the acknowledgement 302 from the specific port, the controller 306 can search (e.g., in a memory, database, lookup table, etc.) for a device that is assigned to the specific port. If the device 310 is assigned to the specific port, the controller 306 can determine that the device 310 has an address matching the target address in the communication 330 and identify the device 310 as the target device.

In response to the identification of the device 310 as the target device, the controller 306 can activate the switching element 312 to activate a direct communication path between the host device 302 and the device 310 on the SCL line. Further, in response to the identification of the device 310 as the target device, the controller 306 can activate the switching element 316 to activate a direct communication path between the host device 302 and the device 310 on the SDA line. The activation of the direct communication path between the host device 302 and the device 310 can allow the host device 302 to communicate with the device 310 using direct communication mode. Also, by activating the direct communication mode on both the SCL and SDA lines, data transmission between the host device 302 and the target device 310 on the SDA line can be synchronized with clock signals on the SCL line between the host device 302 and the device 310.

In response to the identification of the device 310 as the target device, the controller 306 can enable or activate the redriver circuit 324 to activate a redriver path between the host device 302 and the device 320 on the SCL line. Further, in response to the identification of the device 310 as the target device, the controller 306 can enable or activate the redriver circuit 328 to activate a redriver path between the host device 302 and the device 320 on the SDA line. The activation of redriver path between the host device 302 and the device 320 can allow the host device 302 to communicate with the device 320 using redriver mode. By activating the redriver mode on both the SCL and SDA lines, data transmission between the host device 302 and the non-target device 320 on the SDA line can be synchronized with clock signals on the SCL line between the host device 302 and the device 320.

Figure 3B:
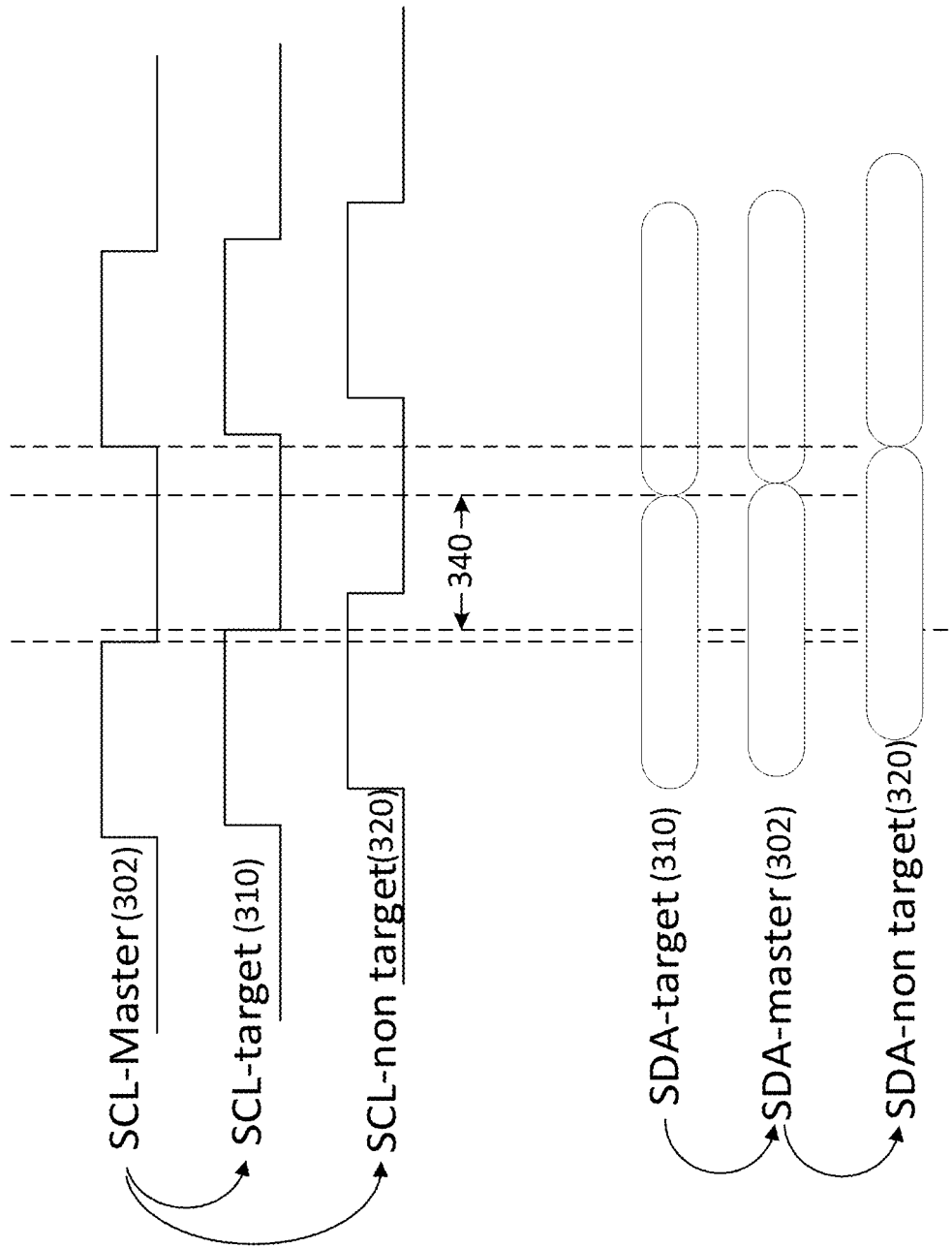
FIG. 3B is a diagram showing timing diagrams relating to the example application shown in FIG. 3A in one embodiment.

Thus, in response to the identification of the device 310 as the target device, the controller 306 and the host device 302 can communicate with the device 310 (e.g., the target device) using direct communication and can communicate with other devices using the redriver mode. This selective communication scheme can allow the host device 302 to, for example, transmit data to the device 310 and the device 320, where the device 320 can receive the data at a later time than the device 310. FIG. 3B is a diagram showing timing diagrams of an example implementation of the system 300 shown in FIG. 3A. The timing diagrams in FIG. 3B show the signal events on the SCL lines and SDA lines of a master device 302 (e.g., host device 302), a target device (e.g., device 310), and a non-target device (e.g., device 320). During communications between the master device and the target device, the master device can launch a falling edge on its SCL line. The launch of the falling edge on the SCL lines of the master device can be distributed to the SCL lines of the target device and the non-target device. On the SDA lines, the target device can transmit data to the master device via the direct communication mode, but the master device needs to completely receive the data on its SDA line within a limited amount of time, such as before an upcoming rising edge on the SCL line of the master device. Thus, a latency 340 between a falling edge of the target device SCL line and a complete output of data on the target device's SDA line can define a system speed of the overall system (e.g., system 300). Further, note that on the SDA line events, the master device can send a copy of the data received from the target device to the non-target device via the redriver mode, which causes a delay in the SDA line of the non-target device. However, this transmission from the master device to the non-target device may not need to be subject to any timing constraint since the non-target device may merely need a copy of the data for system transparency purposes. For example, the master device is not required to completely transmit the copy of the data to the non-target device within a certain amount of time. Thus, the delay introduced by the redriver mode may not post any timing penalty on the overall system.

The systems and methods described herein can allow a master device in a 1:N topology to perform point-to-point communication with a target device and allow the rest of the non-target devices to listen to the traffic simultaneously. The point-to-point communication path with the target device can have a reduced load on the host device because the host device may not see other non-target devices. Further, no re-driving delay is introduced on the communication path between the host device and the target device. Further, communication traffic across a bus can become transparent to non-target devices by having the non-target devices receiving copies of the data being transmitted from the host device to the target device. For example, an I3C system can benefit from this transparency by allowing the host device to remove overheads in setup, and build or disable connections among all the ports connected to slave devices in a hub device or a hub network. The receipt of the copies can be a one-way communication (from the host device to the non-target devices) and thus, does not impact the performance of the overall system.

Figure 4:
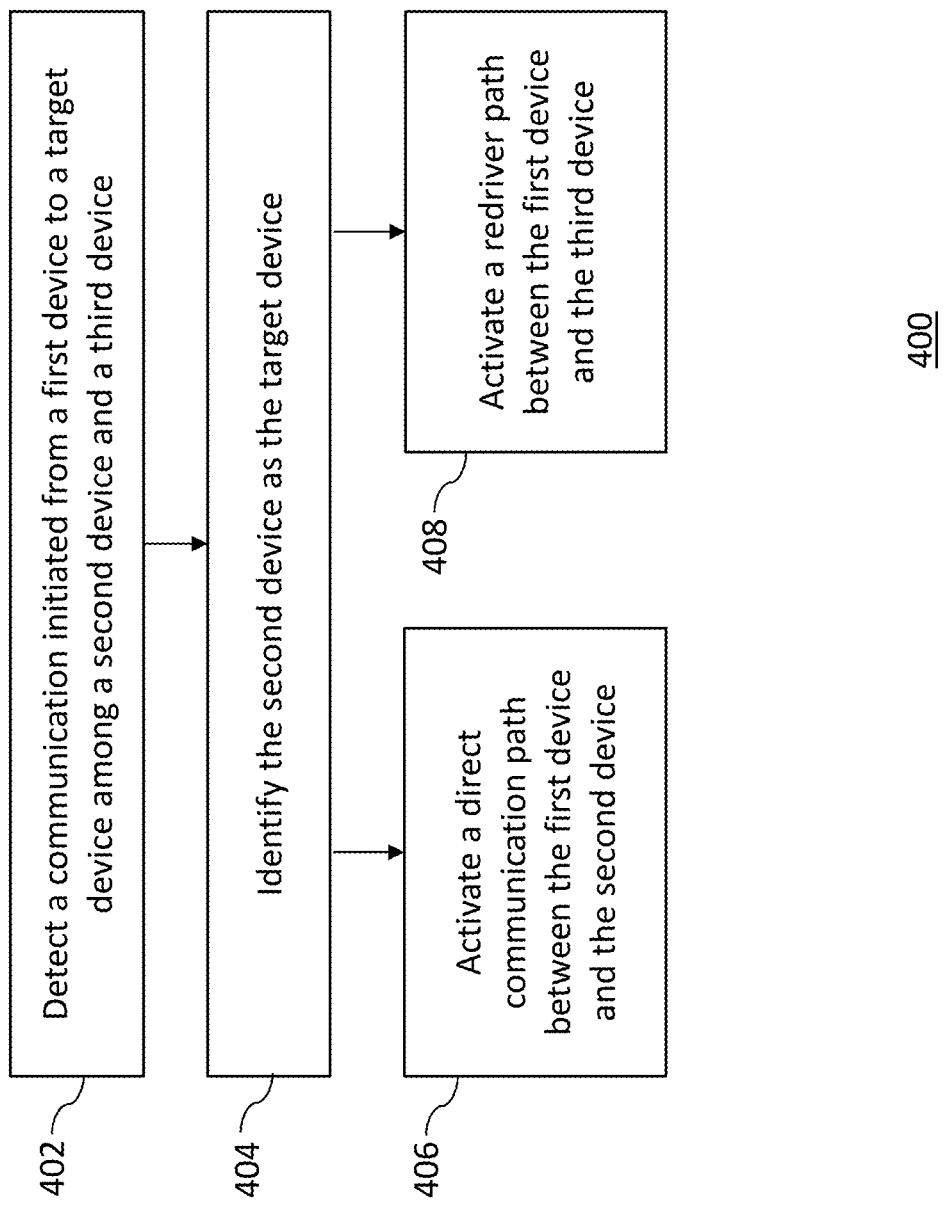
FIG. 4 is a flow diagram illustrating a process of implementing bridging device with analog switch and redriver modes in one embodiment.

FIG. 4 is a flow diagram illustrating a process 400 of implementing bridging device with analog switch and redriver modes in one embodiment. The process 400 can include one or more operations, actions, or functions as illustrated by one or more of blocks 402, 404, 406, and/or 408. Although illustrated as discrete blocks, various blocks can be divided into additional blocks, combined into fewer blocks, eliminated, or performed in parallel, depending on the desired implementation.

The process 400 can begin at block 402. At block 402, a controller can detect a communication initiated from a first device to a target device among a second device and a third device. In some examples, the controller can analyze a data frame structure of the communication initiated from the first device to the target device. The controller can detect the communication initiated from the first device to the target device based on the analysis of the data frame structure. The analysis of the data frame structure can include an identification of a transaction start, a transaction stop, an address phase, and a frame format of the frame structure.

The process 400 can proceed from block 402 to block 404. At block 404, the controller can identify the second device as the target device. In some examples, the controller can receive an acknowledgement signal from one of the second device and third device. The controller can identify a port that received the acknowledgement signal. The controller can identify the second device as the target device based on the identified port.

The process 400 can proceed from block 404 to block 406. At block 406, the controller can, in response to identifying the second device as the target device, activate a direct communication path between the first device and the second device. The activation of the direct communication path can allow the first device to communicate with the second device using direct communication mode. In some examples, activating the direct communication path between the first device and the second device can include activating a switching element connected between the first device to the second device. In some examples, the switching element can be a field effect transistor (FET).

The process 400 can proceed from block 404 to block 408. At block 406, the controller can, in response to identifying the second device as the target device, activate a redriver path between the first device and the third device. The activation of the redriver path can allow the first device to communicate with the third device using redriver mode. In some examples, activating the redriver path between the first device and the third device can include activating a redriver circuit connected between the first device to the third device.

In some examples, the controller can continue to listen for a termination of the communication and potential new communications. For example, the controller can detect a new communication initiated from the first device to a new target device among the second device and the third device. The controller can identify the third device as the new target device. The controller can, in response to identifying of the third device as the new target device, deactivate the direct communication path between the first device and the second device. The controller can, in response to identifying of the third device as the new target device, deactivate the redriver path between the first device and the third device. The controller can, in response to identifying of the third device as the new target device, activate a direct communication path between the first device and the third device to allow the first device to communicate with the third device using direct communication mode. The controller can, in response to identifying of the third device as the new target device, activate a redriver path between the first device and the second device to allow the first device to communicate with the second device using redriver mode.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a logic circuit connected to a first device, a second device, and a third device; and
a controller connected to the logic circuit and the first device, the controller being configured to:
detect a communication initiated from the first device to a target device among the second device and the third device;
identify the second device as the target device; and
in response to the identification of the second device as the target device:
activate, in the logic circuit, a direct communication path between the first device and the second device to allow the first device to communicate with the second device using direct communication mode, wherein a redriver path between the first device and second device remains deactivated; and
activate, in the logic circuit, a redriver path between the first device and the third device to allow the first device to communicate with the third device using redriver mode simultaneously with the communication between the first device and the second device using direct communication mode, wherein a direct communication path between the first device and third device remains deactivated.

2. The apparatus of claim 1, wherein the controller is configured to:
receive an acknowledgement signal from one of the second device and third device;
identify a port that received the acknowledgement signal; and
identify the second device as the target device based on the identified port.

3. The apparatus of claim 1, wherein the controller is configured to:
analyze a data frame structure of the communication initiated from the first device to the target device; and
detect the communication initiated from the first device to the target device based on the analysis of the data frame structure.

4. The apparatus of claim 3, wherein the analysis of the data frame structure comprises an identification of one or more of a transaction start, a transaction stop, an address phase, and a frame format of the frame structure.

5. The apparatus of claim 1, wherein the logic circuit comprises:
a first switching element connected to the second device, wherein the controller is configured to activate the first switching element to activate the direct communication path between the first device and the second device;
a first redriver circuit connected to the second device;
a second switching element connected to the third device; and
a second redriver circuit connected to the third device, wherein the controller is configured to activate the second redriver circuit to activate the redriver path between the first device and the third device.

6. The apparatus of claim 5, wherein the first switching element and the second switching element are field effect transistors (FET).

7. The apparatus of claim 1, wherein the controller is configured to:
detect a new communication initiated from the first device to a new target device among the second device and the third device;
identify the third device as the new target device; and
in response to the identification of the third device as the new target device:
deactivate, in the logic circuit, the direct communication path between the first device and the second device;
deactivate, in the logic circuit, the redriver path between the first device and the third device;
activate, in the logic circuit, the direct communication path between the first device and the third device to allow the first device to communicate with the third device using direct communication mode; and
activate, in the logic circuit, the redriver path between the first device and the second device to allow the first device to communicate with the second device using redriver mode.

8. A system comprising:
a first device;
a second device;
a third device;
a logic circuit connected to the first device, a second device, and a third device; and
a controller connected to the logic circuit and the first device, the controller being configured to:
detect a communication initiated from the first device to a target device among the second device and the third device;
identify the second device as the target device; and
in response to the identification of the second device as the target device:
activate, in the logic circuit, a direct communication path between the first device and the second device to allow the first device to communicate with the second device using direct communication mode, wherein a redriver path between the first device and second device remains deactivated; and
activate, in the logic circuit, a redriver path between the first device and the third device to allow the first device to communicate with the third device using redriver mode simultaneously with the communication between the first device and the second device using direct communication mode, wherein a direct communication path between the first device and third device remains deactivated.

9. The system of claim 8, wherein the controller is configured to:
receive an acknowledgement signal from one of the second device and third device;
identify a port that received the acknowledgement signal; and
identify the second device as the target device based on the identified port.

10. The system of claim 8, wherein the controller is configured to:
analyze a data frame structure of the communication initiated from the first device to the target device; and detect the communication initiated from the first device to the target device based on the analysis of the data frame structure.

11. The system of claim 10, wherein the analysis of the data frame structure comprises an identification of one or more of a transaction start, a transaction stop, an address phase, and a frame format of the frame structure.

12. The system of claim 8, wherein the logic circuit comprises:
a first switching element connected to the second device, wherein the controller is configured to activate the first switching element to activate the direct communication path between the first device and the second device;
a first redriver circuit connected to the second device;
a second switching element connected to the third device; and
a second redriver circuit connected to the third device, wherein the controller is configured to activate the second redriver circuit to activate the redriver path between the first device and the third device.

13. The system of claim 12, wherein the first switching element and the second switching element are field effect transistors (FET).

14. The system of claim 8, wherein the controller is configured to:
detect a new communication initiated from the first device to a new target device among the second device and the third device;
identify the third device as the new target device; and
in response to the identification of the third device as the new target device:
deactivate, in the logic circuit, the direct communication path between the first device and the second device;
deactivate, in the logic circuit, the redriver path between the first device and the third device;
activate, in the logic circuit, the direct communication path between the first device and the third device to allow the first device to communicate with the third device using direct communication mode; and
activate, in the logic circuit, the redriver path between the first device and the second device to allow the first device to communicate with the second device using redriver mode.

15. A method for routing communication among a plurality of devices, the method comprising:
detecting a communication initiated from a first device to a target device among a second device and a third device;
identifying the second device as the target device; and
in response to identifying the second device as the target device:
activating a direct communication path between the first device and the second device to allow the first device to communicate with the second device using direct communication mode, wherein a redriver path between the first device and second device remains deactivated; and
activating a redriver path between the first device and the third device to allow the first device to communicate with the third device using redriver mode simultaneously with the communication between the first device and the second device using direct communication mode, wherein a direct communication path between the first device and third device remains deactivated.

16. The method of claim 15, wherein identifying the second device as the target device comprises:
receiving an acknowledgement signal from one of the second device and third device;
identifying a port that received the acknowledgement signal; and
identifying the second device as the target device based on the identified port.

17. The method of claim 15, wherein detecting the communication initiated from the first device comprises:
analyzing a data frame structure of the communication initiated from the first device to the target device; and
detecting the communication initiated from the first device to the target device based on the analysis of the data frame structure.

18. The method of claim 17, wherein analyzing the data frame structure comprises identifying one or more of a transaction start, a transaction stop, an address phase, and a frame format of the frame structure.

19. The method of claim 15, wherein:
activating the direct communication path between the first device and the second device comprises activating a switching element connected between the first device to the second device; and
activating the redriver path between the first device and the third device comprises activating a redriver circuit connected between the first device to the third device.

20. The method of claim 15, further comprising:
detecting a new communication initiated from the first device to a new target device among the second device and the third device;
identifying the third device as the new target device; and
in response to identifying of the third device as the new target device:
deactivating the direct communication path between the first device and the second device;
deactivating the redriver path between the first device and the third device;
activating the direct communication path between the first device and the third device to allow the first device to communicate with the third device using direct communication mode; and
activating the redriver path between the first device and the second device to allow the first device to communicate with the second device using redriver mode.

* * * * *